(12) United States Patent
Horch et al.

(10) Patent No.: US 7,183,591 B1
(45) Date of Patent: Feb. 27, 2007

(54) TRENCH ISOLATION FOR THYRISTOR-BASED DEVICE

(75) Inventors: Andrew Horch, Sunnyvale, CA (US); Scott Robins, San Jose, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 0 days.

(21) Appl. No.: 11/238,773

(22) Filed: Sep. 29, 2005

Related U.S. Application Data (62) Division of application No. 10/262,729, filed on Oct. 1, 2002, now Pat. No. 6,998,652.

(51) Int. Cl.
*H01L 29/74* (2006.01)
*H01L 27/102* (2006.01)

(52) U.S. Cl. ............... 257/137; 257/149; 257/E29.211; 257/E27.079

(58) Field of Classification Search ................ 257/107, 257/121, 123–125, 133–145, 149, 154, 157–161, 257/173, E27.079, E29.211
See application file for complete search history.

(56) References Cited

U.S. PATENT DOCUMENTS

| | | | |
|---|---|---|---|
| 6,104,045 A | 8/2000 | Forbes et al. | |
| 6,225,165 B1 | 5/2001 | Noble, Jr. et al. | |
| 6,229,161 B1 | 5/2001 | Nemati et al. | |
| 6,790,713 B1* | 9/2004 | Horch | ......................... 438/135 |
| 2002/0190265 A1* | 12/2002 | Hsu et al. | .................... 257/107 |

OTHER PUBLICATIONS

Nemati; A novel thyristor-based SRAM cell (T-RAM) for high-speed, low-voltage, giga-scale memories; Electron Devices Meeting, 1999, IEDM Technical Digest; International, Dec. 5-8, 1999; pp. 283-286.*

K. DeMeyer, S. Kubicek and H. van Meer, Raised Source/Drains with Disposable Spacers for sub 100 nm CMOS Technologies, Extended Abstracts of International Workshop on Junction Technology 2001.

Mark Rodder and D. Yeakley, Raised Source/Drain MOSFET with Dual Sidewall Spacers, IEEE Electron Device Letters, vol. 12, No. 3, Mar. 1991.

(Continued)

*Primary Examiner*—Marcos D. Pizarro (57) ABSTRACT

A semiconductor device includes a thyristor body having at least one region in a substrate. According to an example embodiment of the present invention, a trench is in a substrate and adjacent to a thyristor body region in the substrate. The trench is lined with an insulative material and further includes conductive material that is insulated from the thyristor body region in the substrate by the liner material. A conductive thyristor control port is located in the trench and adapted for capacitively coupling to the thyristor body region in the substrate and to control current in the thyristor body by causing an outflow of minority carriers in the thyristor. With this approach, conductive material can be used to fill a portion of the trench while using the trench portion including the conductive material to electrically isolate a portion of the thyristor body in the substrate. This approach is particularly useful, for example, in high-density applications where insulative trenches having high aspect ratios are desired.

8 Claims, 10 Drawing Sheets

OTHER PUBLICATIONS

Yang-Kyu Choi, Daewon Ha, Tsu-Jae King and Chenming Hu, Nanoscale Ultrathin PMOSFETs with Raised Selective Germanium Source/Drain, IEEE Electron Device Letters, vol. 22, No. 9, Sep. 2001.

N. Lindert, Y. K. Choi, L. Chang, E. Anderson, W. C. Lee, T. J. King. J. Bokor, and C. Hu, Quasi-Planar FinFETs with Selectively Grown Germanium Raised Source/Drain, 2001 IEEE International SOI Conference, Oct. 2001.

T. Ohguro, H. Naruse, H. Sugaya, S. Nakamura, E. Morifuji, H. Kimijima, T. Yoshitomi, T. Morimoto, H.S. Momose, Y. Katsumata, and H. Iwai, High Performance RF Characteristics of Raised Gate/Source/Drain CMOS with Co Salicide, 1998 Symposium on VLSI Technology Digest of Technical Papers.

Hsiang-Jen Huang, Kun-Ming Chen, Tiao-Yuan Huang, Tien-Sheng Chao, Guo-Wei Huang, Chao-Hsin Chien, and Chun-Yen Chang, Improved Low Temperature Characteristics of P-Channel MOSFETs with Si1-xGex Raised Source and Drain, IEEE Transactions on Electron Devices, vol. 48, No. 8, Aug. 2001.

Nemati; A Novel Thyristor-Based SRAM Cell (T-RAM) for High-Speed, Low-Voltage, Giga-Scale Memories; Electron Devices Meeting, 1999; IEDM Technical Digest; International, Dec. 5-8, 1999; pp. 283-286.

Stanley Wolfe Ph.D. and Richard N. Tauber Ph.D., Silicon Processing for the VLSI Era, vol. 1, 1986, pp. 285-286.

* cited by examiner

TRENCH ISOLATION FOR THYRISTOR-BASED DEVICE

FIELD OF THE INVENTION

This patent application is a divisional of patent application Ser. No. 10/262,729 filed Oct. 1, 2002 now U.S. Pat. No. 6,998,652, which is incorporated herein by reference. The present invention is directed to semiconductor devices and, more specifically, to thyristor-based semiconductor devices, such as thyristor-based memory devices and other thyristor-based current-switching circuits.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other circuitry used to store information. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Conventional NDR-based SRAM cells, however, have many problems that have prohibited their use in commercial SRAM products. These problems include, among others: high standby power consumption due to the large current needed in one or both of the stable states of the cell; excessively high or excessively low voltage levels needed for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for thyristor-based applications. An important consideration in the design of the thin capacitively-coupled thyristor device involves designing the body of the thyristor sufficiently thin, so that the capacitive coupling between the control port and the thyristor base region can substantially modulate the potential of the base region. Another important consideration in semiconductor device design, including those employing thin capacitively coupled thyristor-type devices and memory implementations, includes forming devices in a very dense array. In order to achieve such a dense array, it is sometimes desirable to form trenches having a very high aspect ratio (the ratio of height to width of the opening of the trench). Portions of the devices must be electrically insulated from other circuitry, however, and commonly used insulative materials are difficult to implement when filling trenches having high aspect ratios (e.g., greater than 2:1).

These and other design considerations have presented challenges to efforts to implement such a thin capacitively coupled thyristor in bulk substrate applications, and in particular to highly dense applications.

SUMMARY

The present invention is directed to overcoming the above-mentioned challenges and others related to the types of devices and applications discussed above and in other memory cells. The present invention is exemplified in a number of implementations and applications, some of which are summarized below.

According to an example embodiment of the present invention, a thyristor-based (i.e., thyristor-including) semiconductor device is manufactured having a substrate and a thyristor body, wherein at least one region of the thyristor body is in the substrate. A trench is provided in the substrate adjacent to the thyristor region in the substrate, and an insulative liner material is formed in the trench. A conductive material is formed in a portion of the lined trench laterally adjacent to the thyristor region in the substrate, with the insulative liner material electrically insulating the conductive material from the thyristor region in the substrate. A conductive thyristor control port is formed in the trench and adapted for capacitively coupling to the thyristor body. The thyristor body region in the substrate is arranged having a cross section such that the capacitive coupling of a voltage transition from the control port results in an outflow of minority carriers from the thyristor body region. The outflow of minority carriers switches the thyristor-based semiconductor device at least from a current-passing mode to a current-blocking mode for current flow between the opposite end regions of the thyristor body. With this approach, conductive material can be used to fill a trench portion that also electrically isolates part of the thyristor, and permits the manufacture of trenches having high aspect ratios. This approach is particularly useful in applications where forming insulative material in the trench is difficult due to the aspect ratio being relatively high.

In another example embodiment of the present invention, a memory arrangement includes a memory cell including the thyristor-based semiconductor device in the example embodiment discussed above. The thyristor includes anode and cathode end portions, each end portion having a base region electrically coupled to an emitter region, and each base region being electrically coupled to one another. The memory cell also includes a pass device having source/drain regions separated by a channel region and a gate capacitively coupled to the channel region. One of the source/drain regions is coupled in series with the thyristor at a first one of the emitter regions, and another one of the source/drain regions is coupled to a bit line. A first word line is adapted to apply a voltage to the gate of the pass device for controlling the current flow therein, where the pass device forms a conductive link between the bit line and the thyristor when the pass device is in a conducting state. A second word line is adapted to apply a voltage to the control port of the thyristor for controlling current flow therein, and a second one of the emitter regions is coupled to a conductor at a reference voltage.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor applications, and has been found to be particularly useful for thyristor-based applications (including memory devices) benefiting from trench isolation. For instance, the present invention has been found to be applicable to high-density and/or high aspect-ratio applications. While the present invention is not necessarily limited to such applications, various aspects of the invention may be appreciated through a discussion of various examples using this context.

According to an example embodiment of the present invention, a trench is formed in a semiconductor substrate adjacent to a thyristor region in the substrate, the trench being lined with an insulative material and filled with a conductive material. The trench is formed at least on one side of the thyristor region in the substrate and, in various implementations, is formed extending around some of or the entire thyristor region. Particularly useful for forming the thyristor region in high-density applications, the insulative and/or conductive materials are adapted to electrically insulate the thyristor region from other circuitry in the device. For example, in applications where typical insulators cannot fill high aspect ratio trenches (e.g., due to the tendency of the insulator to fill an upper portion of the trench before a lower portion of the trench is filled), the material used to fill the lined trench can be selected as a function of its suitability for the specified trench; polysilicon and Tungsten are often adequate. This approach has been found to be particularly useful in applications having trench aspect ratios of 2:1, 3:1 or even higher.

A conductive thyristor control port is formed in the trench and adapted for causing an outflow of minority carriers in the thyristor region in the substrate for controlling current flow therein (e.g., current flow between opposite end regions of the thyristor). Specifically, the thyristor body region is sufficiently thin such that the coupling of one or more voltage transitions thereto via the control port causes the outflow and switches the thyristor between a current-passing mode and a current-blocking mode. In one particular implementation, the conductive filler material is used to offset the control port from a lower base region of the thyristor, wherein it has been discovered that the switching speed and other characteristics of the thyristor are improved via the separation.

Figure 1A:
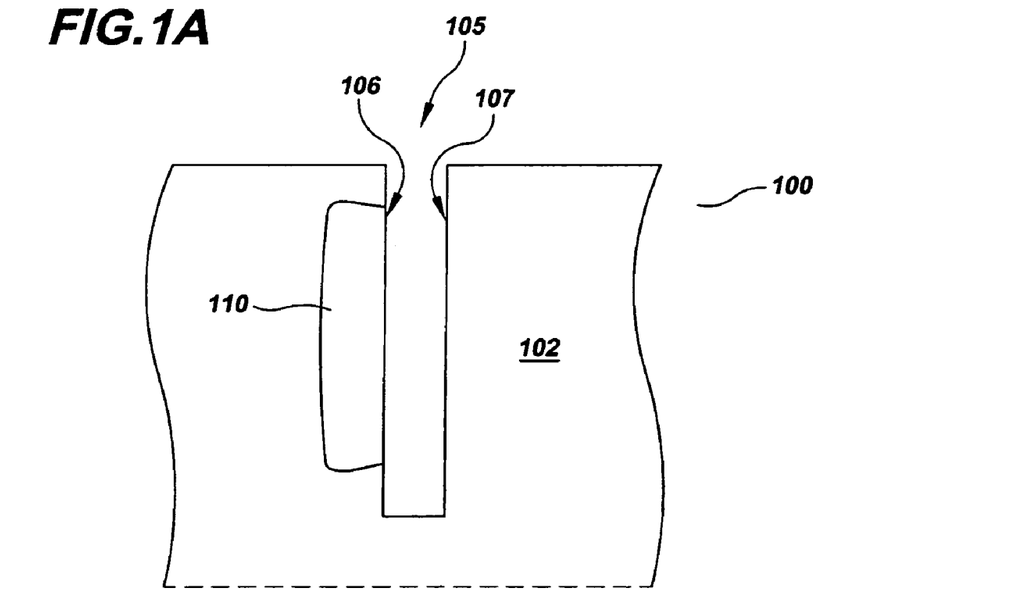
FIG. 1A is a cross-sectional illustration of a semiconductor device having a trench etched therein, the device shown at a stage of processing according to an example embodiment of the present invention.
Figure 1B:
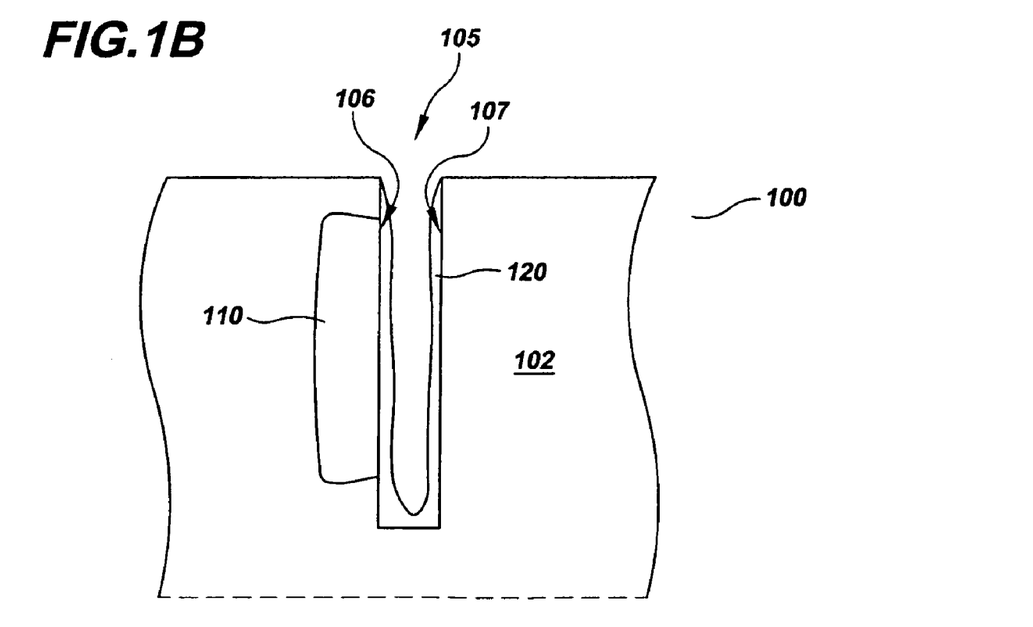
FIG. 1B is a cross-sectional illustration of the semiconductor device of FIG. 1A with the device shown having an insulative liner formed in the trench, also according to the present invention.
Figure 1C:
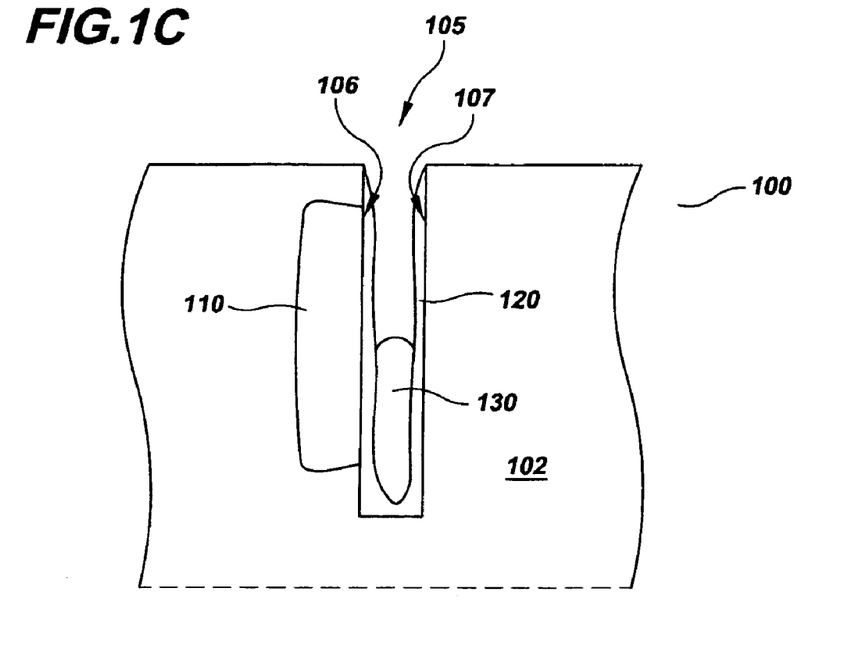
FIG. 1C is a cross-sectional illustration of the semiconductor device of FIG. 1B with the device shown having a conductive material formed in the lined trench, also according to the present invention.

FIGS. 1A through 1D show a semiconductor device 100 being manufactured, according to an example embodiment of the present invention. In FIG. 1A, a trench 105 having sidewall portions 106 and 107 is etched in a substrate 102. The trench 105 is adjacent to a thyristor body portion 110 in the substrate. In one implementation, the trench 105 has a relatively high height-to-width aspect ratio (e.g., at least 2:1) that allows the device 100 to be formed in a dense arrangement with other circuitry, such as other similar semiconductor devices. The thyristor body portion may include, for example, one or more portions of a thyristor, such as a base region, which is coupled to other thyristor regions as discussed in connection with subsequent figures. The trench 105 is then lined with an insulative liner material 120, as shown in FIG. 1B. Next, a conductive material 130 is formed in the lined trench, as shown in FIG. 1C. The conductive material can be, for example, polysilicon or similar material. The combination of the insulative liner 120 and the conductive material 130 collectively serve to fill the trench 105 and electrically isolate a portion of the thyristor region 110 from other circuitry in the substrate 102 (e.g., circuitry on a side of the trench opposite from the thyristor region 110).

Figure 1D:
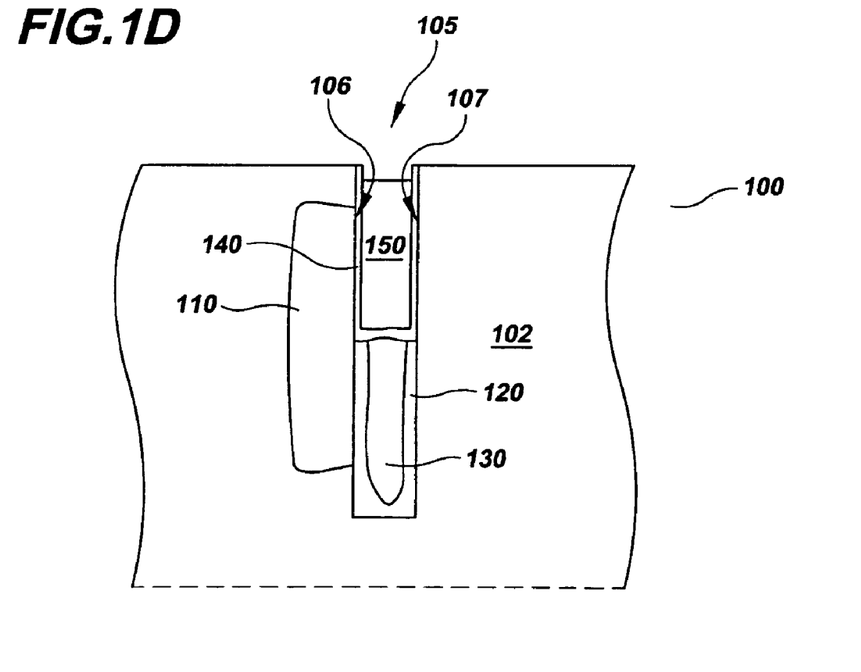
FIG. 1D is a cross-sectional illustration of the semiconductor device of FIG. 1C with the device shown having a control port being formed over the conductive portion, also according to the present invention.

After the conductive material 130 is formed in the trench 105, the device undergoes further processing for specific application needs. For example, as shown in FIG. 1D, the liner 120 is etched away in an upper portion of the trench 105, and a dielectric material 140 is formed in the trench. A control port 150 is then formed in an upper portion of the trench 105 and is adapted to be capacitively coupled to the thyristor region 110 via the dielectric material and to control thyristor current flow. In another implementation, the conductive material 130 is used as an etch stop for etching the insulative liner material 120. In still another implementation, some or all of the conductive material 130 is removed, prior to forming a control port over the conductive material.

Various ones of the example embodiments described below in connection with the figures share similar features with each other and with FIGS. 1A–1D. In connection with each of these figures, certain discussion of similar features (that are similarly numbered) is omitted for brevity.

Figure 1E:
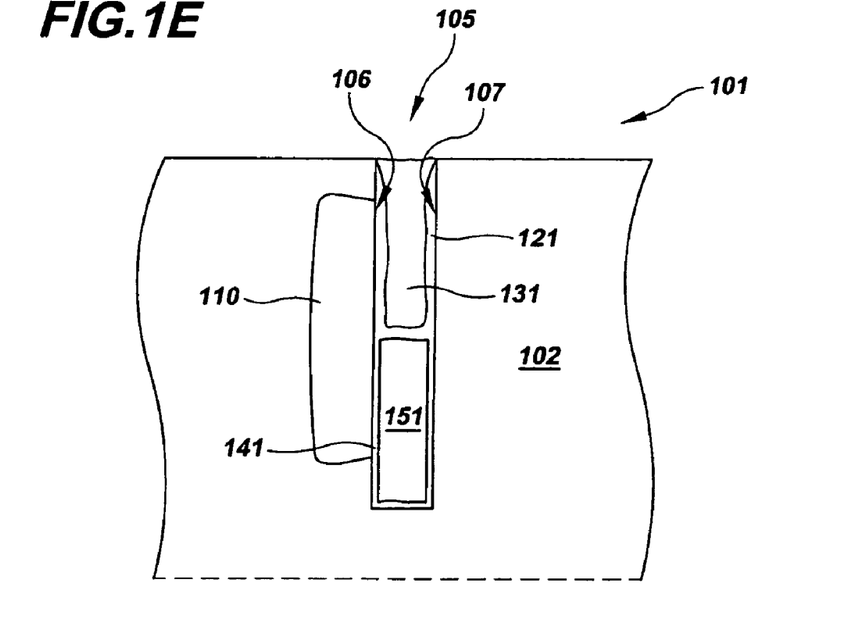
FIG. 1E is a cross-sectional illustration of a semiconductor device, similar to the device shown in FIG. 1D and having a conductive portion filling an insulative trench and over a thyristor control port, according to another example embodiment of the present invention.

In FIG. 1E, another example embodiment of the present invention, conductive material 131 is formed over a control port 151 in the trench. In this implementation, the trench 105 has sidewalls 106 and 107, such as shown in FIG. 1A. A dielectric liner material 141 is then formed on a sidewall 106 of the trench that faces a thyristor body region 110 in the substrate, and the control port 151 is formed near the bottom of the trench 105. An insulative liner 121 is then formed in the trench 105 and over the control port 151, and conductive material 131 is formed in the portion of the trench 105 lined with the insulative liner 121. The insulative liner 121 electrically isolates the conductive material from the thyristor region, and the portion of the lined trench including the conductive material electrically isolates the thyristor region 110 from other circuitry in the device. In a more particular implementation (not shown), the conductive material is used to inhibit the control port from being implanted during a subsequent ion implant step for a different portion of the semiconductor device.

Figure 2A:
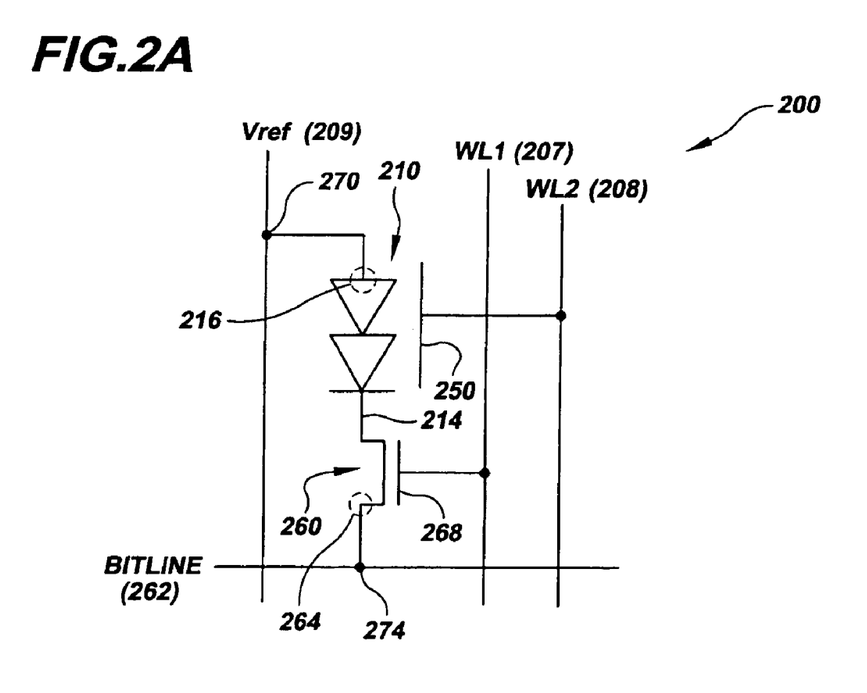
FIG. 2A is a circuit diagram of a thyristor-based device having an anode contact with a varied width, according to another example embodiment of the present invention.

FIG. 2A is another circuit arrangement 200, according to a particular example application and embodiment of the present invention. The circuit arrangement 200 includes a thyristor body 210 and a pass device 260 (e.g., a transistor) electrically coupled in series and adapted for storing data at node 214. In one implementation, the data (e.g., voltage level) at node 214 is responsive to a state (conducting or blocking) of the thyristor. Control ports 250 and 268 are adapted to control current flow in the thyristor body 210 and the pass device 260, respectively, in response to signals applied to first (WL1) and second (WL2) word lines 207 and 208. A contact 270 electrically couples a signal from a reference voltage (Vref) line 209 to an emitter region 216 of the thyristor body 210. In addition, a bit line contact 274 is adapted to electrically couple a signal from a bit line 262 to a source/drain region 264 of the pass device 260. In response to signals applied to WL1 and WL2, and using signals at the bit line 262 and Vref line 209, the device 200 is adapted for writing data to and/or reading data from the storage node 214.

The control port 250 is in a trench having conductive filler material near a bottom portion of the trench that is lined with an insulative material. In one implementation, the control port 250 sufficiently surrounds at least a portion of the thyristor body 210 such that voltage pulses applied to the control port changes the potential across a majority of a cross-section of the thyristor body. The lined bottom portion and conductive filler material fill the bottom portion of the trench and electrically insulate portions of the thyristor body and control port 250. For more information regarding data storage and manipulation with a thyristor-based device, such as the device 200, and in particular for controlling current in a thyristor-based device with a capacitively coupled control port, reference may be made to U.S. Pat. No. 6,229,161.

Figure 2B:
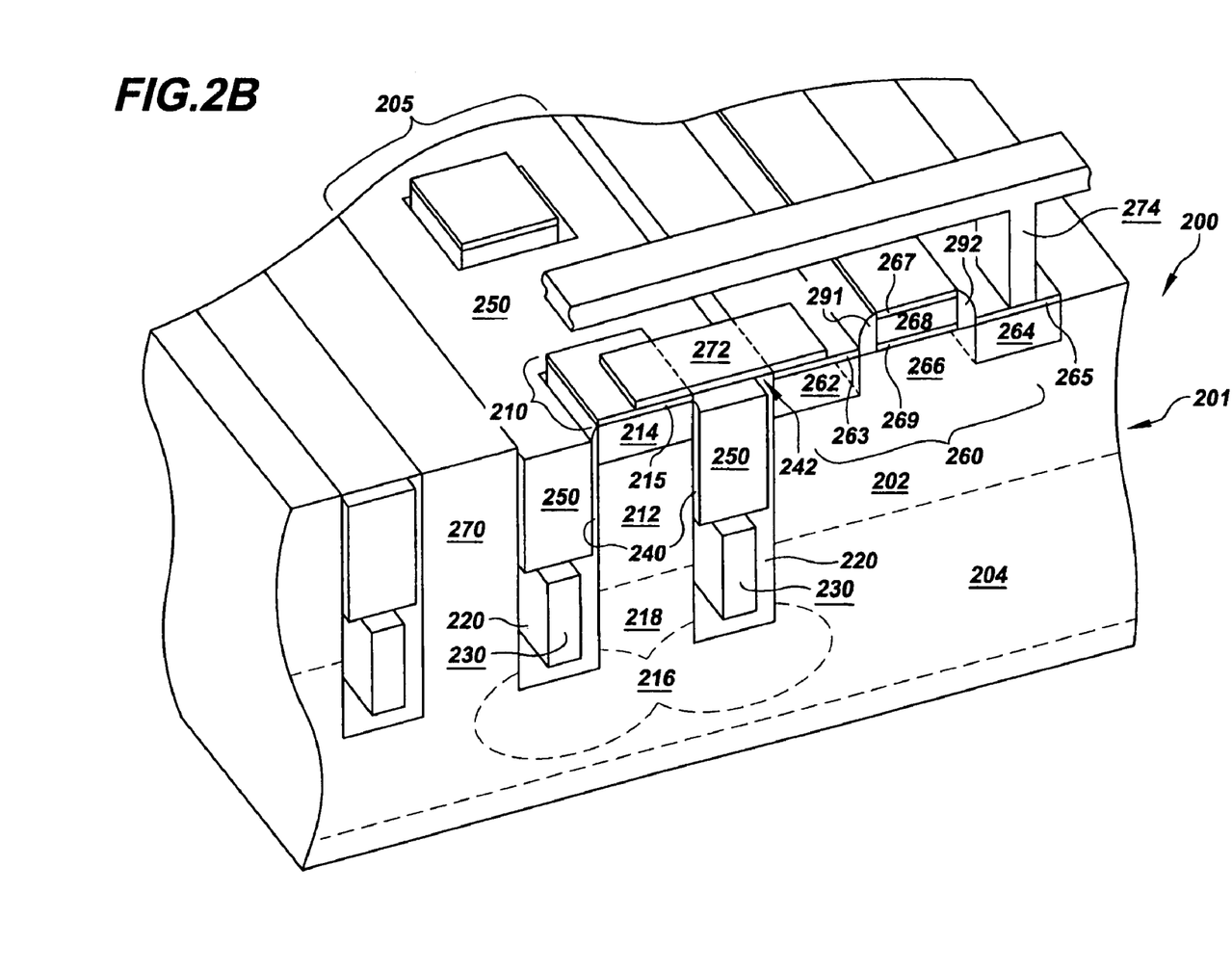
FIG. 2B is a three-dimensional cross-sectional illustration of a semiconductor device having an insulative trench that may be implemented in connection with the circuit diagram of FIG. 2A, according to another example embodiment of the present invention.

FIG. 2B shows a cross-section of a thyristor-based semiconductor device 200 that may, for example, be implemented to correspond to the circuit arrangement 200 in FIG. 2A, according to another example embodiment of the present invention. The device 200 is formed using a trench having a conductive portion in a substrate 201 to electrically isolate a portion of a thyristor. The thyristor-based device 200 may be formed, for example, using one or more of the methods described in connection with FIGS. 1A–1D. A P+ anode sinker 270 is implanted in a portion of the substrate and used for contacting a buried emitter region 216 of a thyristor body 210 and is optionally annealed to drive a portion of the doping further into the substrate. The anode sinker is useful for bringing a contact, such as a reference voltage, to the thyristor.

A trench 205 is etched around a thyristor region 210 and into the substrate 201, and a P+ implant is effected via a bottom portion of the trench 205 to form the P+ emitter region 216. The trench 205 is lined with a liner material 220, filled with a first conductive material 230 (e.g., polysilicon and/or metal) that is then etched back to a desired level. In one implementation, the insulative material used to line the bottom portion of the trench further offsets control port 250 from a lower N base region 218 (discussed below). The liner material 220 above the first conductive material 230 is etched using the first conductive material 230 as an etch stop. A gate dielectric material 240 is formed in the trench and a second conductive material is deposited and etched back to a desired level to form control port 250 in the trench adjacent to the gate dielectric material and at least partially surrounding the thyristor region 210. Oxide and/or another insulative material 242 is then formed over the control port and subsequently planarized.

After the trench 205 is processed, thyristor body portions including an N-base region 218 and N-well region 204 are implanted, followed by the implantation of a P-base region 212 and P-well region 202. In an alternate implementation, the N-base region 218 is implanted prior to the formation of the trench (e.g., with a blanket implant also implanting N-well region 204). The thyristor also includes a P+ emitter region 216 previously implanted through the trench and coupled to the P+ sinker 270. An N+ emitter region 214 is implanted over the P-base region 212 and completes the body portion of the thyristor. The control port 250 is adapted for capacitively coupling to the P-base region 212 via the gate dielectric material 240. The N-base region 218 is electrically insulated from other circuitry in the device via the portion of the trench 205 including the first conductive portion 230 and the insulative liner 220. The control port 250 is adapted to switch the thyristor between a blocking state and a conducting state in response to a voltage being applied thereto. In one implementation, the N-well region 204 is electrically contacted and held at a voltage (not shown).

A logic device 260 is electrically coupled in series with the thyristor, having N+ source/drain regions 262 and 264 formed in the P-well region 202 and separated by a channel region 266. A gate dielectric material 269 is formed over the channel region 266, and a gate electrode 268 is formed capacitively coupled to the channel region via the gate dielectric material, with sidewall spacers 292 and 291 formed on opposing sides of the gate electrode 268. Portions 215, 263, 265 and 267 over the N+ emitter 214, source/drain regions 262 and 264, and gate 268, respectively, are salicided. An interconnect 272 is formed between the source/drain region 262 and the emitter region 214 of the thyristor via salicide 263 and 215. Another interconnect 274 electrically couples the source/drain region 264 to other circuitry in the device (e.g., interconnect 274 may include a bit line) via salicide 265. The gate 268 is adapted to switch the channel 266 between a blocking state and a conducting state in response to a voltage being applied thereto, and thus forms a conductive channel between the bit line 274 and the emitter region 214. An STI (Shallow Trench Isolation) region, which is hidden behind the interconnect 274, is used to insulate memory cells in the array.

In another example embodiment of the present invention, the thyristor-based device of FIG. 2B is adapted for use as a memory cell. Specifically, the state of the N+ emitter region 214 is used for storing data for read and write access, for example, as discussed above. Interconnect 274 is used as a bit line, the gate 268 is part of a first word line, the control port 250 is part of a second word line and the P+ anode sinker 270 is coupled to a reference voltage. The bit line is electrically coupled to the N+ emitter region 214 when the logic device 260 (used here as a pass device for access to the storage node 214) is in a conducting state effected by a voltage being applied to the first word line. In addition, the N+ emitter region 214 is electrically coupled to the P+ anode sinker 270 in response to a voltage being applied to the second word line, and the voltage of the sinker is applied to the N+ emitter region. By controlling the first and second word lines and the bit line (e.g., as described in U.S. Pat. No. 6,229,161), data bits can be read from and/or written to the data-storing N+ emitter region 214.

In another example embodiment of the present invention (not shown), the first conductive material 230 is shorted to a conductor that maintains the first conductive material 230 at a selected voltage at which the conductor is held. The voltage level is selected for the particular application in which the thyristor-based device is being used, and in one implementation, is selected to reduce stress on dielectric material (e.g., 220, 240) adjacent to the conductive material 230. In addition, the conductor may include one or more of a variety of conductors in the semiconductor device. For instance, the conductor may include a portion of the thyristor, a well region and/or an interconnect.

In another example embodiment of the present invention, the first conductive material 230 is adapted to capacitively couple to the N-base region 218 and to reduce capacitive coupling effects from the control port 250 to the N-base 218. In one particular implementation, the conductive material 230 capacitively couples a signal to the N-base 218 in response to a voltage being applied to a conductor to which it is shorted, as discussed above. In another particular implementation, the conductive material 230 is coupled to a word line and adapted to capacitively couple to the N-base 218 in response to a voltage being applied to the word line. The voltage applied to the word line may, for example, be opposite in polarity from a voltage applied to the control port 250 for capacitively coupling to the P-base 212.

In one implementation, and referring again to FIG. 2B, the control port 250 is adapted for coupling pulses for providing primary control for switching the thyristor body 210 between a stable current-blocking state and a stable current-passing state. In another implementation, the control port 250 and the thyristor body 210 are arranged such that one or more voltage pulses of the control port 250 (e.g., via coupling to a word line) changes the potential across a majority of a cross-section of the P-base region 212. In still another implementation, the control port 250 is arranged for changing the potential across a majority of a cross-section of the P-base region 212 independently from any MOS-inversion channel formation against the thyristor body 210.

Figure 2C:
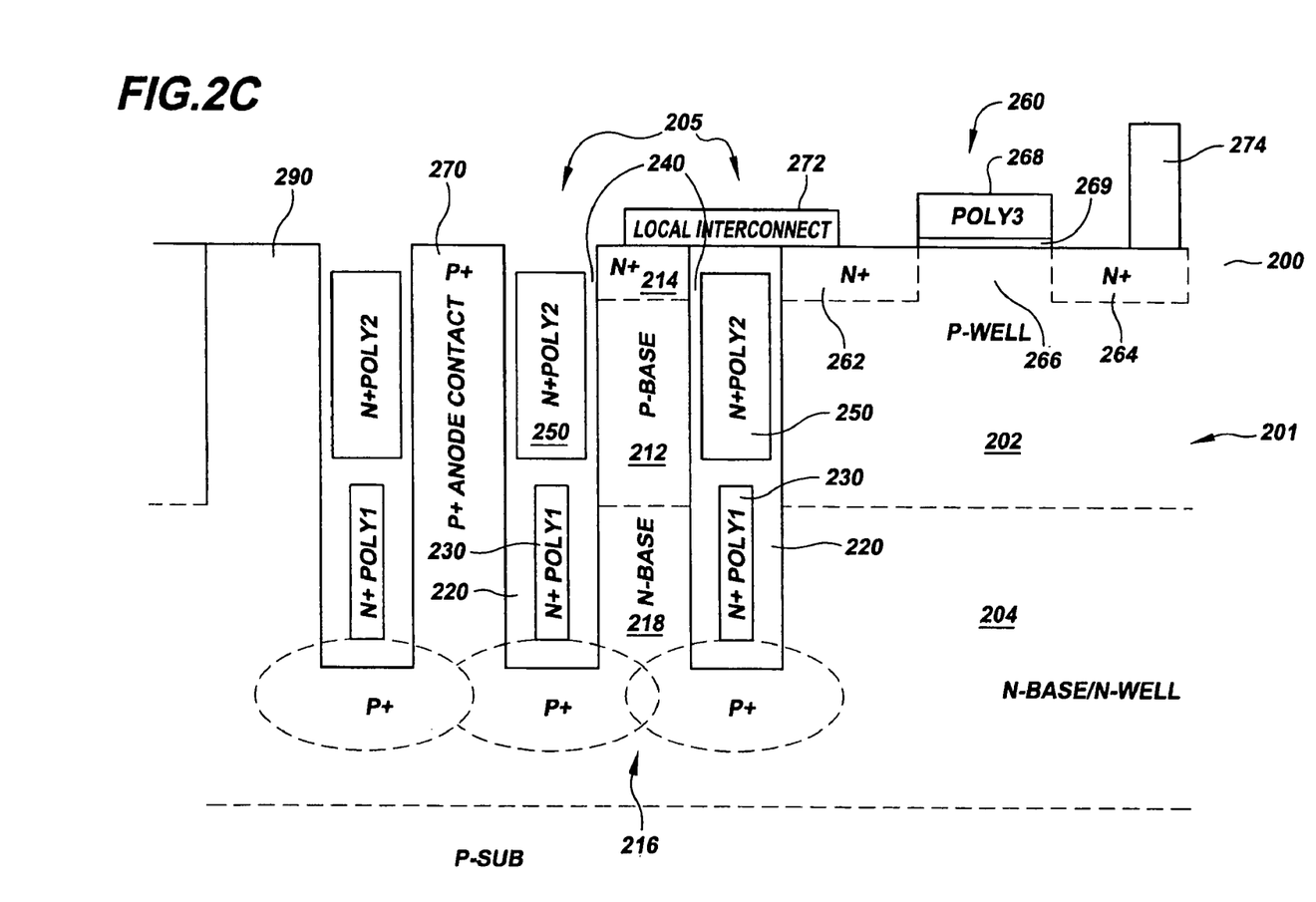
FIG. 2C is a cross-sectional illustration of the semiconductor device of FIG. 2B and having an N-well contact, according to another example embodiment of the present invention.

FIG. 2C shows the thyristor-based semiconductor device 200 of FIG. 2B having an N-well contact 290 coupled to the N-well region 204, according to a more particular example embodiment of the present invention. The N-well contact 290 may include, for example, N-doped polysilicon, metal or other conductive material. The N-well contact 290 is configured and arranged for reducing the lifetime of carriers in the buried emitter region 216. In connection with the present invention, it has been discovered that using such an N-well contact is particularly useful, for example, when the thyristor-based device undergoes a write-to-blocking-state operation in a memory application. In such applications, the time that it takes to drain carriers from the buried emitter region (carrier lifetime) slows down the switching of the thyristor from low to high resistance states. By reducing this lifetime, the switching speed of the device is increased, making faster memory operation possible. In one particular implementation, faster switching is achieved by coupling the N-well contact to a voltage supply and holding the N-well contact at a voltage that is at least as high as the voltage at which the buried emitter region 216 is held.

Figure 3A:
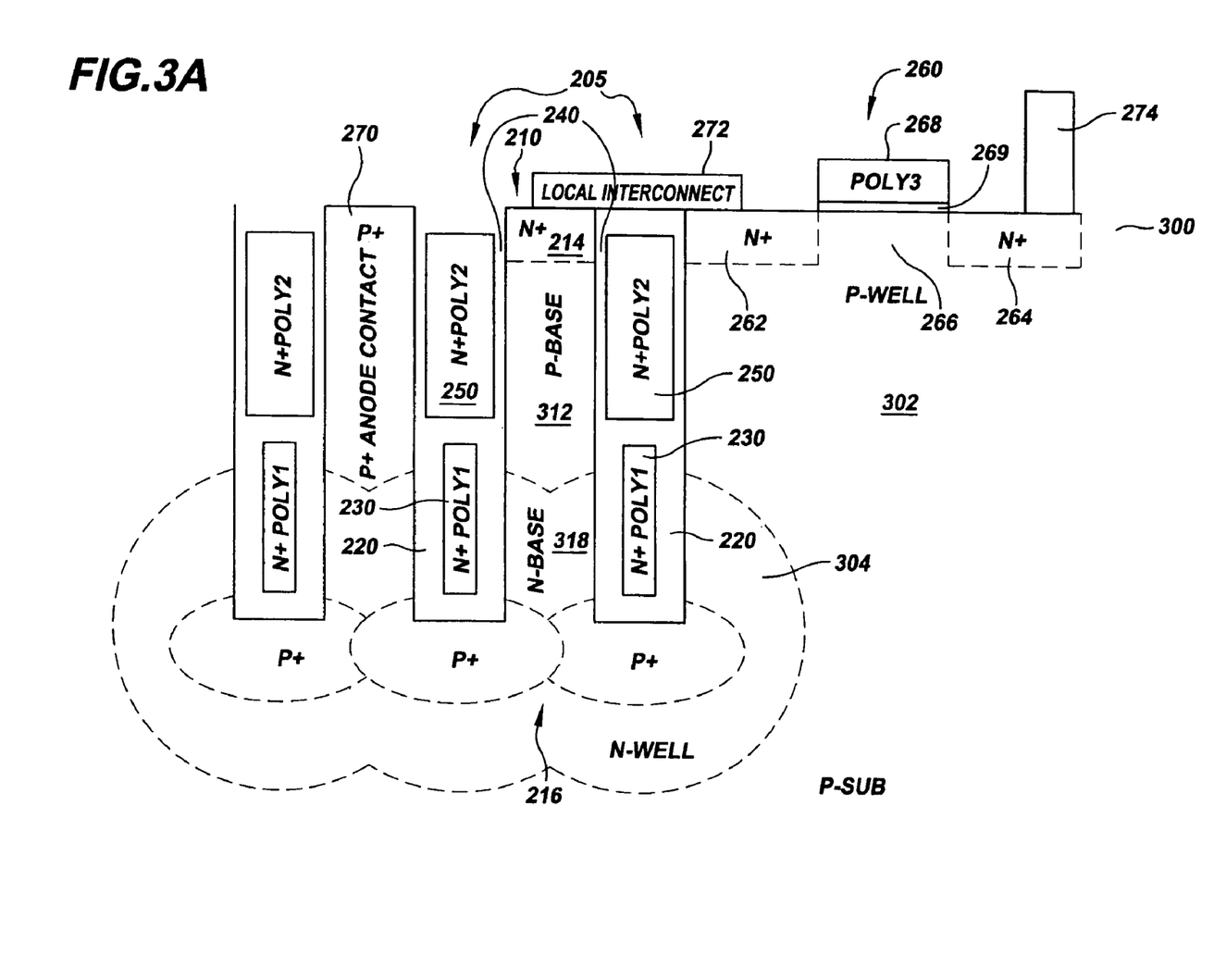
FIG. 3A is a cross-sectional illustration of a semiconductor device having an insulative trench, according to another example embodiment of the present invention.

FIG. 3A shows another thyristor-based semiconductor device 300, according to another example embodiment of the present invention. The semiconductor device 300 is formed in a manner similar to that of FIG. 2B, except that N-well (or N-base) region 304 is blanket implanted before the trench is filled via the bottom portion of the trench 205 and subsequently annealed. The trench is typically formed by depositing a material such as nitride before the trench etch and using the nitride as an etch stop for later planarization steps. The nitride etch stop material blocks the N-base and anode implants from being implanted in the top of the thyristor body region 210, and a side wall spacer (not shown) is formed to prevent side walls of the trench from being implanted. These side wall spacers and etch stops are subsequently removed. In addition, the resulting P-well region 302 and P-base region 312 are formed after the trench is filled, and may exhibit different shape corresponding to implant of the N-base region 304.

Figure 3B:
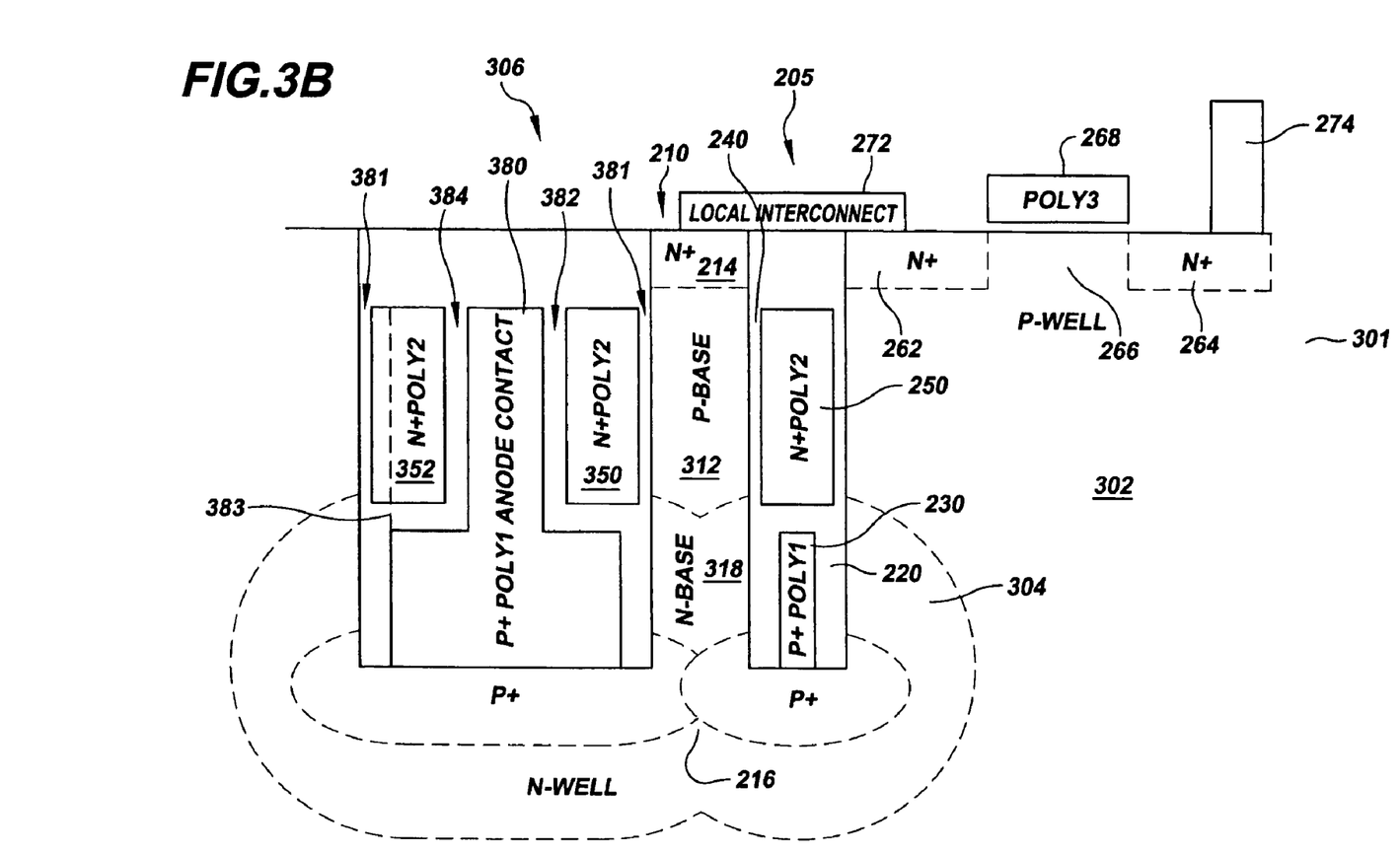
FIG. 3B is a cross-sectional illustration of another semiconductor device having an insulative trench, similar to the device of FIG. 3A and having an anode contact with a varied thickness, according to another example embodiment of the present invention.

FIG. 3B shows a thyristor-based semiconductor device 301, similar to device 300 of FIG. 3A but having a trench 306 with a P+ anode contact 380 that is etched, as shown, so that N+ control ports 250 (including portion 350) and 352 can be formed over the anode contact. Control port 250 including portion 350 is capacitively coupled to P-base region 312, similarly to control port 250 in FIG. 3A, and control port 352 may be used for contact for additional thyristor-based devices. In one implementation (not shown), the P+ anode contact 380 is not etched where the control port 352 is shown, resulting in the P+ anode contact 380 having a profile shown by dotted line 383, and the control port 352 is not formed. In the implementation shown, a trench 306 is etched and subsequently lined with an insulative liner material 381. A conductive material 380 is formed in the lined trench, masked and etched to form the resulting P+ anode contact structure shown. Insulative liner materials 382 and 384 are then formed over the anode contact 380, and the N+ control ports 250 and 352 are formed over the liner materials 382 and 384. The insulative liner materials 381, 382 and 384 are adapted to electrically insulate the P+ anode contact 380 from the N-base region 318 and the N+ control ports 350 and 352.

Figure 4:
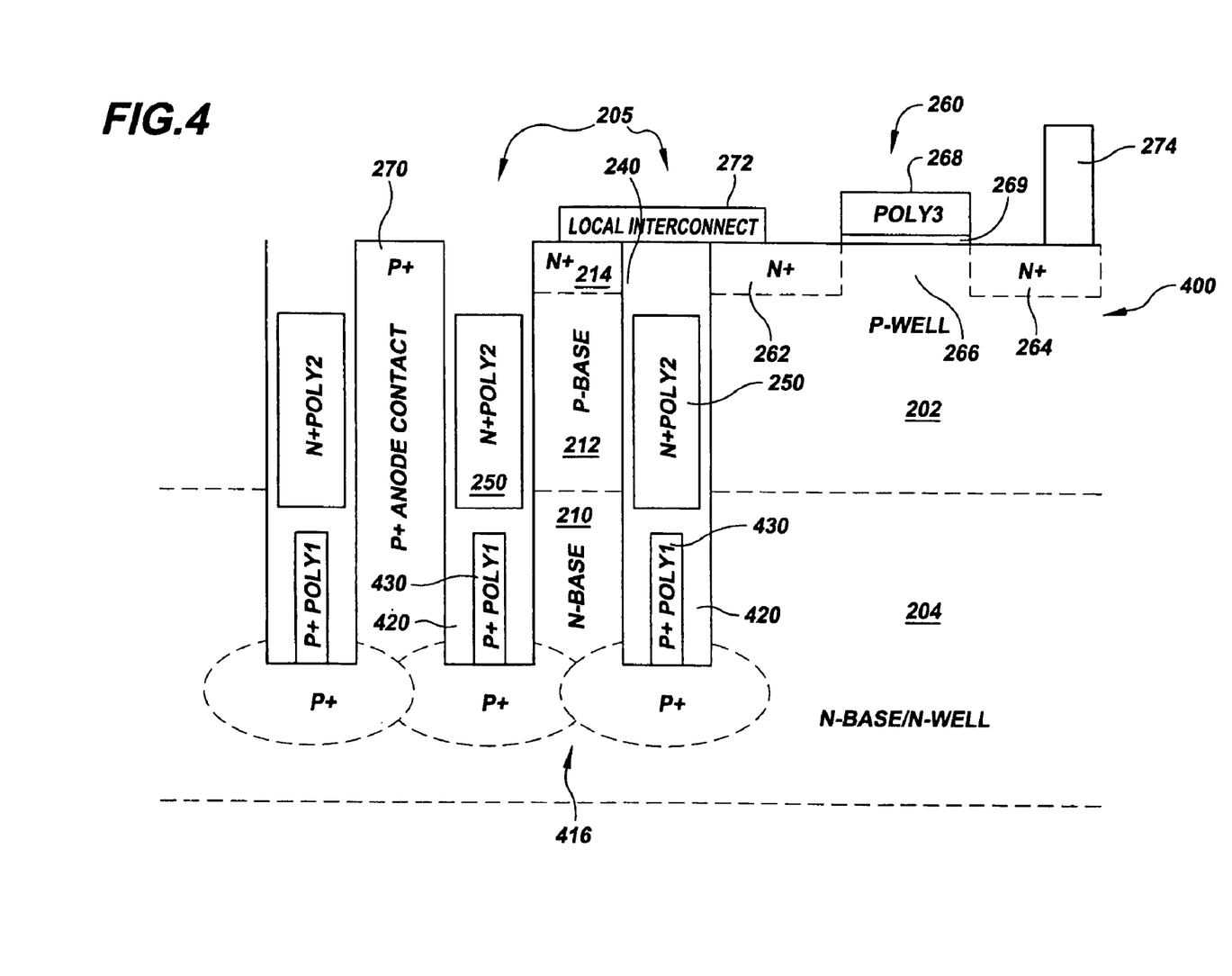
FIG. 4 is a cross-sectional illustration of a semiconductor device having an insulative trench, according to another example embodiment of the present invention.

FIG. 4 is another thyristor-based semiconductor device 400, according to another example embodiment of the present invention. The device 400 is similar to the device 200 in FIG. 2B, except wherein the liner oxide 420 is formed such that the first conductive material 430 can be formed at the bottom of the trench 205. In addition, the P+ anode portion 416 is formed by out-diffusing dopant from the first conductive material through the bottom of the trench, rather than by implant. In one more particular implementation, the device 400 is heated in a manner that enhances out-diffusion of the first conductive material into the substrate below and adjacent to the trench.

Figure 5:
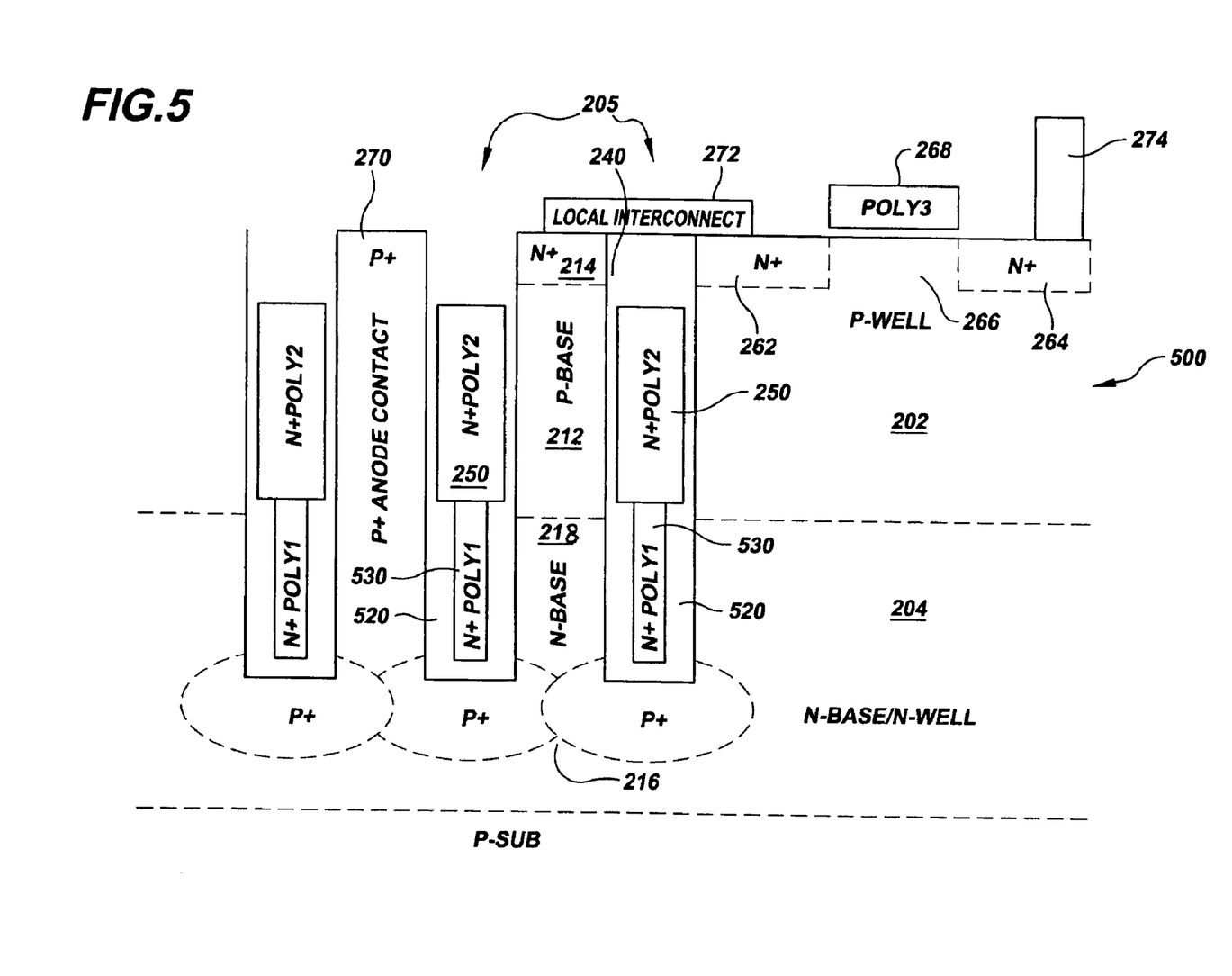
FIG. 5 is a cross-sectional illustration of a semiconductor device having an insulative trench, according to another example embodiment of the present invention.

FIG. 5 is another thyristor-based semiconductor device 500, similar to the device shown in FIG. 2B except wherein the first and second conductive materials 250 and 530 are electrically coupled to one another, according to another example embodiment of the present invention. The insulative liner 520 is formed thick enough to electrically isolate (e.g., reduce the capacitive coupling of) the first conductive portion 530 from the N-base region 218 when the first conductive portion is at the voltage being applied to the second conductive portion 250 (the thyristor control port).

Figure 6:
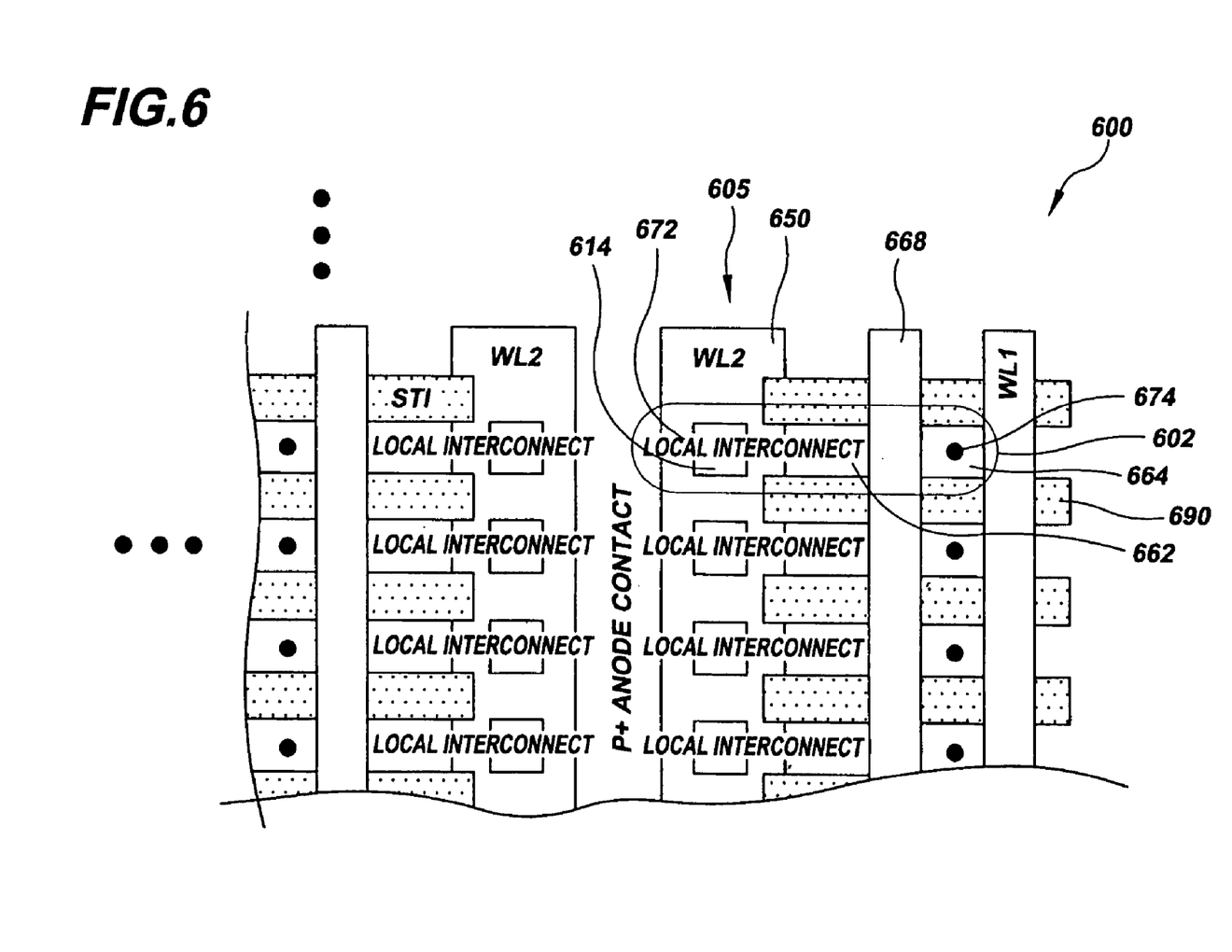
FIG. 6 is a layout illustration of an array of semiconductor devices with insulative trenches, according to another example embodiment of the present invention.

The example embodiments described herein are applicable to a variety of implementations. FIG. 6 shows one such implementation having a plurality of thyristor-based devices that form a memory array 600, according to another example embodiment of the present invention. The array includes memory cells, such as representative cell 602, separated by shallow trench isolation (STI) 690 and adapted to store information. The memory cell 602 may, for example, be viewed in connection with the other figures and corresponding discussion above, with similar features having similar numbering. Using cell 602 as a representative example, word line 668 forms the gate of a pass device having source/drain regions 662 and 664 (e.g., similar to source/drain regions 262 and 264 of logic device 260 of FIG. 2B). The cell 602 further includes a thyristor having vertical portions with an N+ cathode region 614 at an upper portion and coupled in series with the pass device via interconnect 672. The thyristor is coupled to a control port 650 formed in a trench 605 around the thyristor. The trench 605 further includes a filled lower portion including a conductive portion surrounded by a trench liner and adapted to electrically isolate a portion of the thyristor from the conductive portion. The filled lower portion of the trench may include one or more of similar materials shown in the other figures, such as the conductive material 130 and insulative liner 120 of FIG. 1C, or the conductive material 230 and insulative liner 220 of FIG. 2B. In this implementation, the N-well contact discussed in connection with FIG. 2C is not shown.

As an alternative approach, any of the above embodiments can be modified using the approach(es) illustrated and described in concurrently-filed U.S. Provisional Patent Application Ser. No. 60/415,356, entitled "Novel Minority Carrier Isolation Device."

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors and shunts; adding structures to the integrated circuit device; increasing the number of PN sections in the thyristor; and interchanging P and N regions in the device structures and/or using PMOSFETS or MOSFETS rather than NMOSFETS. In addition, for more information regarding implementations to which the present invention is applicable, reference may be made to U.S. Pat. No. 6,229,161, which is fully incorporated herein by reference. Such modifications and changes do not depart from the true spirit and scope of the present invention that is set forth in the following claims.

What is claimed is:

1. A semiconductor device comprising:
    a substrate;
    a thyristor body having a plurality of regions including opposite end regions and at least one body region in the substrate;
    a trench region in the substrate and laterally adjacent to said at least one thyristor body region in the substrate, the trench region including an insulative liner material and a conductive material in a portion of the trench region that is lined, the insulative liner material being arranged to electrically insulate the conductive material from said at least one body region in the substrate; and
    a conductive thyristor control port in the trench and configured and arranged for capacitively coupling at least one voltage transition to the at least one thyristor body region in the substrate, wherein the at least one thyristor body region in the substrate has a cross section adapted so that the capacitive coupling of at least one voltage transition from the control port results in an outflow of minority carriers from said one thyristor body region and switches the thyristor-based semiconductor device at least from a current-passing mode to a current-blocking mode for current flow between the opposite end regions of the thyristor body;
    wherein the conductive material is over the control port.

2. A semiconductor device comprising:
    a substrate;
    a thyristor body having a plurality of regions including opposite end regions and at least one body region in the substrate;

a trench region in the substrate and laterally adjacent to said at least one thyristor body region in the substrate, the trench region including an insulative liner material and a conductive material in a portion of the trench region that is lined, the insulative liner material being arranged to electrically insulate the conductive material from said at least one body region in the substrate; and a conductive thyristor control port in the trench and configured and arranged for capacitively coupling at least one voltage transition to the at least one thyristor body region in the substrate, wherein the at least one thyristor body region in the substrate has a cross section adapted so that the capacitive coupling of at least one voltage transition from the control port results in an outflow of minority carriers from said one thyristor body region and switches the thyristor-based semiconductor device at least from a current-passing mode to a current-blocking mode for current flow between the opposite end regions of the thyristor body;

wherein the control port is shorted to the conductive material and wherein the insulative liner is adapted to inhibit the shorted conductive material from switching a portion of the thyristor body region in the substrate adjacent to the conductive material between a blocking state and a conducting state.

3. A semiconductor device comprising:

a substrate;

a thyristor body having a plurality of regions including opposite end regions and at least one body region in the substrate;

a trench region in the substrate and laterally adjacent to said at least one thyristor body region in the substrate, the trench region including an insulative liner material and a conductive material in a portion of the trench region that is lined, the insulative liner material being arranged to electrically insulate the conductive material from said at least one body region in the substrate; and a conductive thyristor control port in the trench and configured and arranged for capacitively coupling at least one voltage transition to the at least one thyristor body region in the substrate, wherein the at least one thyristor body region in the substrate has a cross section adapted so that the capacitive coupling of at least one voltage transition from the control port results in an outflow of minority carriers from said one thyristor body region and switches the thyristor-based semiconductor device at least from a current-passing mode to a current-blocking mode for current flow between the opposite end regions of the thyristor body;

wherein the trench region at least partially surrounds the at least one thyristor body region in the substrate;

wherein the conductive thyristor control port at least partially surrounds the at least one thyristor body region in the substrate; and wherein the conductive thyristor control port surrounds at least two opposite sides of the at least one thyristor body region in the substrate.

4. A semiconductor device comprising:

a substrate;

a thyristor body having a plurality of regions including opposite end regions and at least one body region in the substrate;

a trench region in the substrate and laterally adjacent to said at least one thyristor body region in the substrate, the trench region including an insulative liner material and a conductive material in a portion of the trench region that is lined, the insulative liner material being arranged to electrically insulate the conductive material from said at least one body region in the substrate; and a conductive thyristor control port in the trench and configured and arranged for capacitively coupling at least one voltage transition to the at least one thyristor body region in the substrate, wherein the at least one thyristor body region in the substrate has a cross section adapted so that the capacitive coupling of at least one voltage transition from the control port results in an outflow of minority carriers from said one thyristor body region and switches the thyristor-based semiconductor device at least from a current-passing mode to a current-blocking mode for current flow between the opposite end regions of the thyristor body;

wherein the conductive material is disposed on an unlined bottom portion of the trench.

5. A semiconductor device comprising:

a substrate;

a thyristor body having a plurality of regions including opposite end regions and at least one body region in the substrate;

a trench region in the substrate and laterally adjacent to said at least one thyristor body region in the substrate, the trench region including an insulative liner material and a conductive material in a portion of the trench region that is lined, the insulative liner material being arranged to electrically insulate the conductive material from said at least one body region in the substrate; and a conductive thyristor control port in the trench and configured and arranged for capacitively coupling at least one voltage transition to the at least one thyristor body region in the substrate, wherein the at least one thyristor body region in the substrate has a cross section adapted so that the capacitive coupling of at least one voltage transition from the control port results in an outflow of minority carriers from said one thyristor body region and switches the thyristor-based semiconductor device at least from a current-passing mode to a current-blocking mode for current flow between the opposite end regions of the thyristor body;

wherein the conductive material is shorted to a conductor in the semiconductor device in a manner that maintains the conductive material at a voltage level of the conductor.

6. The semiconductor device of claim 5, wherein the conductive material is shorted to a conductor that is adapted to hold the conductive material at a voltage level that reduces stress on dielectric material adjacent to the conductive material.

7. The semiconductor device of claim 5, the conductive material is shorted to a portion of a thyristor that includes the thyristor body region in the substrate.

8. The semiconductor device of claim 5, wherein the conductive material is shorted to a well region adjacent to the trench.

* * * * *